United States Patent
Lien et al.

(10) Patent No.: US 10,902,925 B1
(45) Date of Patent: Jan. 26, 2021

(54) PEAK AND AVERAGE CURRENT REDUCTION FOR OPEN BLOCK CONDITION

(71) Applicant: SanDisk Technologies LLC, Addison, TX (US)

(72) Inventors: Yu-Chung Lien, San Jose, CA (US); Michael Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/688,587

(22) Filed: Nov. 19, 2019

(51) Int. Cl.
| | | |
|---|---|---|
| *G11C 16/04* | (2006.01) | |
| *G11C 16/26* | (2006.01) | |
| *G11C 16/34* | (2006.01) | |
| *H01L 27/11556* | (2017.01) | |
| *H01L 27/11582* | (2017.01) | |
| *G11C 16/08* | (2006.01) | |

(52) U.S. Cl.
CPC .......... *G11C 16/26* (2013.01); *G11C 16/0483* (2013.01); *G11C 16/08* (2013.01); *G11C 16/3459* (2013.01); *H01L 27/11556* (2013.01); *H01L 27/11582* (2013.01)

(58) Field of Classification Search
CPC ..... G11C 16/26; G11C 16/0483; G11C 16/08; G11C 16/3459; H01L 27/11556; H01L 27/11582
See application file for complete search history.

(56) References Cited

U.S. PATENT DOCUMENTS

| | | | |
|---|---|---|---|
| 8,937,835 B2 | 1/2015 | Lei et al. | |
| 9,009,568 B2 | 4/2015 | Luo et al. | |
| 9,349,479 B1 | 5/2016 | Sehgal et al. | |
| 9,536,617 B2 | 1/2017 | Al-Shamma et al. | |
| 9,715,939 B2 * | 7/2017 | Ellis | G11C 16/3459 |
| 9,785,493 B1 | 10/2017 | Zhang et al. | |
| 10,026,488 B2 | 7/2018 | Reusswig et al. | |
| 10,430,275 B2 * | 10/2019 | Tokutomi | G06F 11/1012 |
| 2019/0180823 A1 | 6/2019 | Dak et al. | |
| 2020/0143890 A1 * | 5/2020 | Lee | G11C 16/16 |

* cited by examiner

*Primary Examiner* — Pho M Luu
(74) *Attorney, Agent, or Firm* — Dickinson Wright PLLC; Steven Hurles

(57) ABSTRACT

A memory apparatus and method of operation is provided. The apparatus includes a block of memory cells arranged in strings and connected to word lines overlying one another in a stack. The apparatus includes a control circuit configured to determine whether the memory cells of the block are all programmed. The control circuit determines a boundary word line splitting the word lines into first and second word line sets connected to the memory cells that are respectively programmed and not programmed in response to determining the memory cells of the block are not all programmed. The control circuit applies a delta adjusted read voltage being a default read pass voltage minus a delta voltage to a subset of the second word line set separated from the boundary word line in the stack by at least an offset number of the word lines while reading a first group of memory cells.

20 Claims, 21 Drawing Sheets

| BOUNDARY WL | VREAD | NOTE |
|---|---|---|
| X | DEFAULT VREAD | DATA WL RIGHT BELOW THE JOINT HAS NO NWI EFFECT BECAUSE IT IS THE LAST WL AT LOWER TIER, AND NO DATA BEING PROGRAMMED RIGHT ABOVE IT |
| LAST WL | DEFAULT VREAD | CLOSED BLK |
| OTHER WLs | DEFAULT VREAD - $\Delta$ | |

*FIG. 13B*

PEAK AND AVERAGE CURRENT REDUCTION FOR OPEN BLOCK CONDITION

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory apparatus includes memory cells which may be arranged in strings, for instance, where select gate transistors are provided at the ends of the string to selectively connect a channel of the string to a source line or bit line. However, various challenges are presented in operating such memory devices. Accordingly, there is still a need for improved memory apparatuses.

SUMMARY

This section provides a general summary of the present disclosure and is not a comprehensive disclosure of its full scope or all of its features and advantages.

An object of the present disclosure is to provide a memory apparatus and a method of forming the memory apparatus that address and overcome the above-noted shortcomings.

Accordingly, it is an aspect of the present disclosure to provide an apparatus including a block of memory cells arranged in strings and connected to word lines overlying one another in a stack. The memory cells of the apparatus include a first group of memory cells connected to a particular word line. The apparatus also includes a control circuit coupled to the word lines. The control circuit is configured to determine whether the memory cells of the block are all programmed. The control circuit is also configured to determine a boundary word line splitting the word lines into a first word line set connected to the memory cells being programmed and a second word line set connected to the memory cells being not programmed in response to determining the memory cells of the block are not all programmed. The control circuit is additionally configured to apply a delta adjusted read voltage being a default read pass voltage minus a delta voltage to a subset of the second word line set separated from the boundary word line in the stack by at least an offset number of the word lines while reading the first group of memory cells.

According to another aspect of the disclosure a controller in communication with a block of memory cells of a memory apparatus arranged in strings and connected to word lines overlying one another in a stack is provided. The memory cells of the memory apparatus include a first group of memory cells connected to a particular word line. The controller is configured to instruct the memory apparatus to determine whether the memory cells of the block are all programmed. The controller determines a boundary word line splitting the word lines into a first word line set connected to the memory cells being programmed and a second word line set connected to the memory cells being not programmed in response to determining the memory cells of the block are not all programmed. The controller is also configured to instruct the memory apparatus to apply a delta adjusted read voltage being a default read pass voltage minus a delta voltage to a subset of the second word line set separated from the boundary word line in the stack by at least an offset number of the word lines while reading the first group of memory cells.

According to an additional aspect of the disclosure, a method of operating a memory apparatus including a block of memory cells arranged in strings and connected to word lines overlying one another in a stack is provided as well. The memory cells of the memory apparatus include a first group of memory cells connected to a particular word line. The method includes the step of determining whether the memory cells of the block are all programmed. The next step of the method is determining a boundary word line splitting the word lines into a first word line set connected to the memory cells being programmed and a second word line set connected to the memory cells being not programmed in response to determining the memory cells of the block are not all programmed. The method continues with the step of applying a delta adjusted read voltage being a default read pass voltage minus a delta voltage to a subset of the second word line set separated from the boundary word line in the stack by at least an offset number of the word lines while reading the first group of memory cells.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 13B is a table showing how the memory apparatus adjusts a default read pass voltage for word lines above a boundary word line plus an offset number of word lines according to aspects of the disclosure;

DETAILED DESCRIPTION

Figure 1:
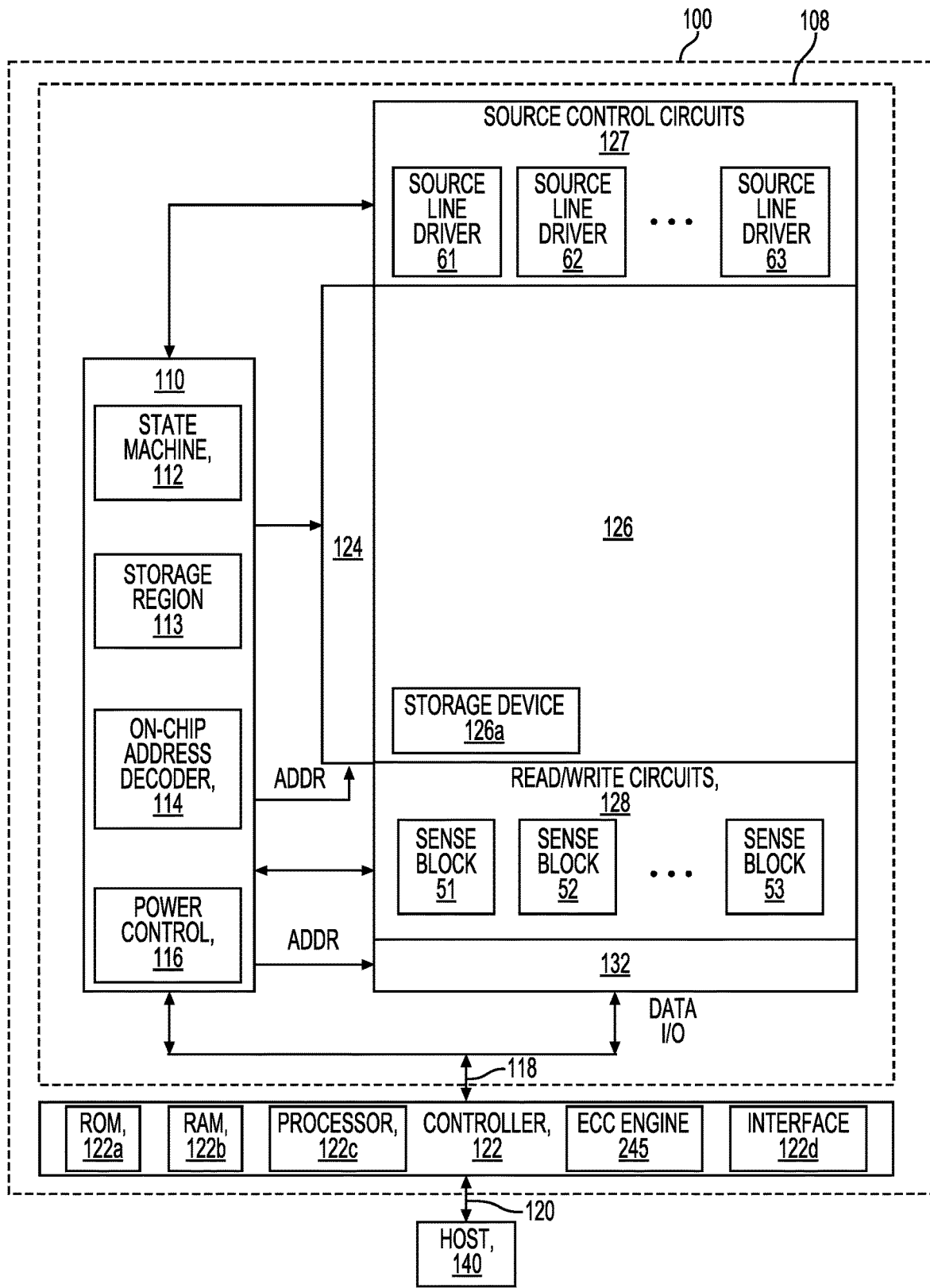
FIG. 1 is a block diagram of an example memory device according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage (Vth) of the memory cell exceeds the read voltage. The read voltages are set at levels which are expected to be between the threshold voltage levels of adjacent data states.

Electrical current is consumed throughout the operation of the memory device or apparatus, including programming and reading operations, for example. Increased average current draw (Icc) for the memory apparatus can unfavorably impact battery life of a mobile device utilizing the memory apparatus. Thus, both a smaller average current draw (Icc) and current draw (Icc) peak are desirable. It is observed that both the current draw peak and average current draw increase when the block are not fully programmed (i.e., open block). Such open block operation can result from the memory apparatus programming several dies with usage of few word lines to determine program performance, for example.

FIG. 1 is a block diagram of an example memory device. The memory device 100, such as a non-volatile storage apparatus, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

In one approach, control circuitry 110 is also in communication with source control circuits 127, which includes source line driver 61, source line driver 62, . . . , source line circuit 63. The source line drivers are used to drive different (or the same) voltages on individual source lines.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine 245 can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. The control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements or cells may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements or cells located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements or cells are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements or cells may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
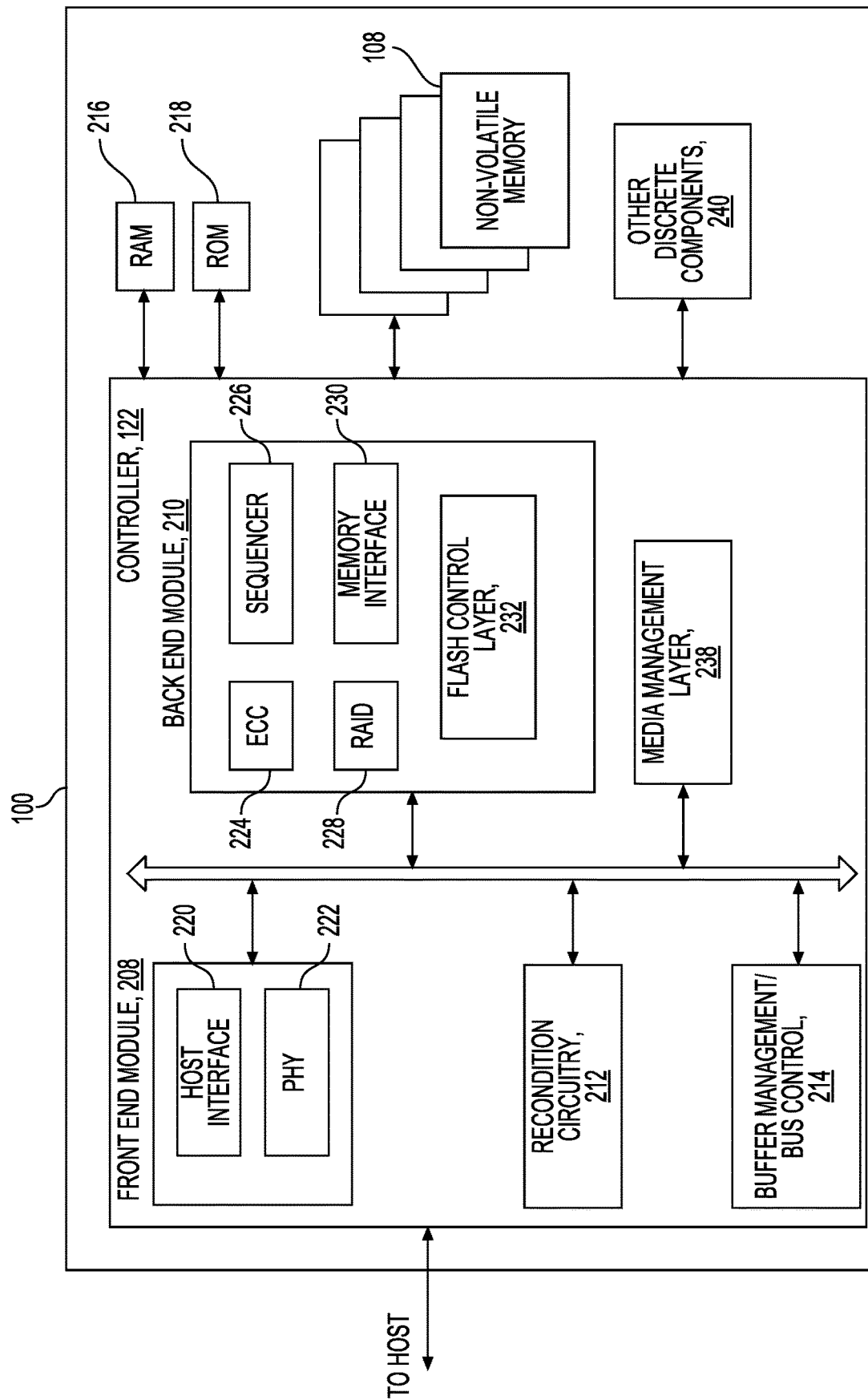
FIG. 2 is a block diagram of the example memory device, depicting additional details of a controller according to aspects of the disclosure.

FIG. 2 is a block diagram of the example memory device or apparatus 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device or apparatus 100 include media management layer 238, which performs wear leveling of memory cells of non-volatile memory die 108. The memory system also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
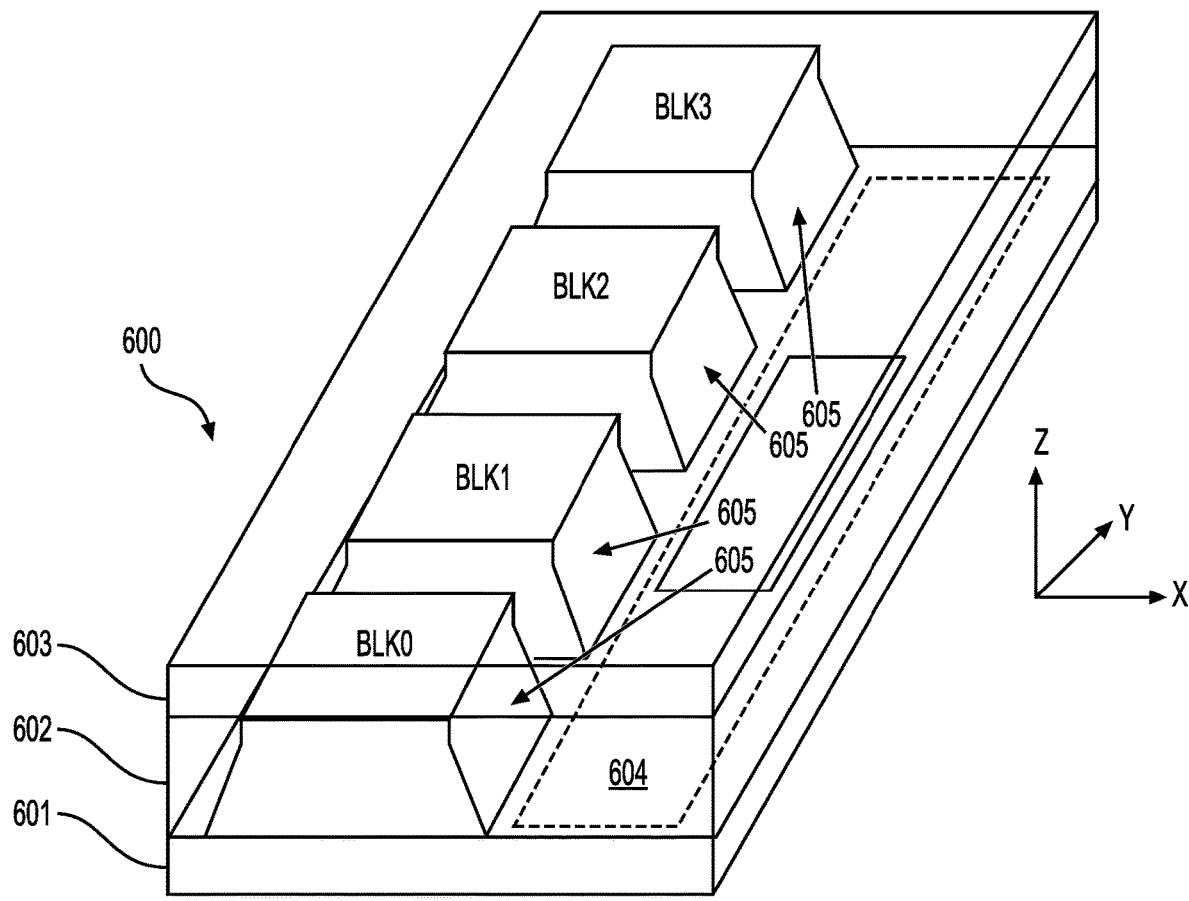
FIG. 3 is a perspective view of another memory device comprising a set of blocks in an example 3D configuration of a memory structure of the example memory device of FIG. 1 according to aspects of the disclosure.

FIG. 3 is a perspective view of a memory device or apparatus 600 comprising a set of blocks in an example 3D configuration of the memory structure 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
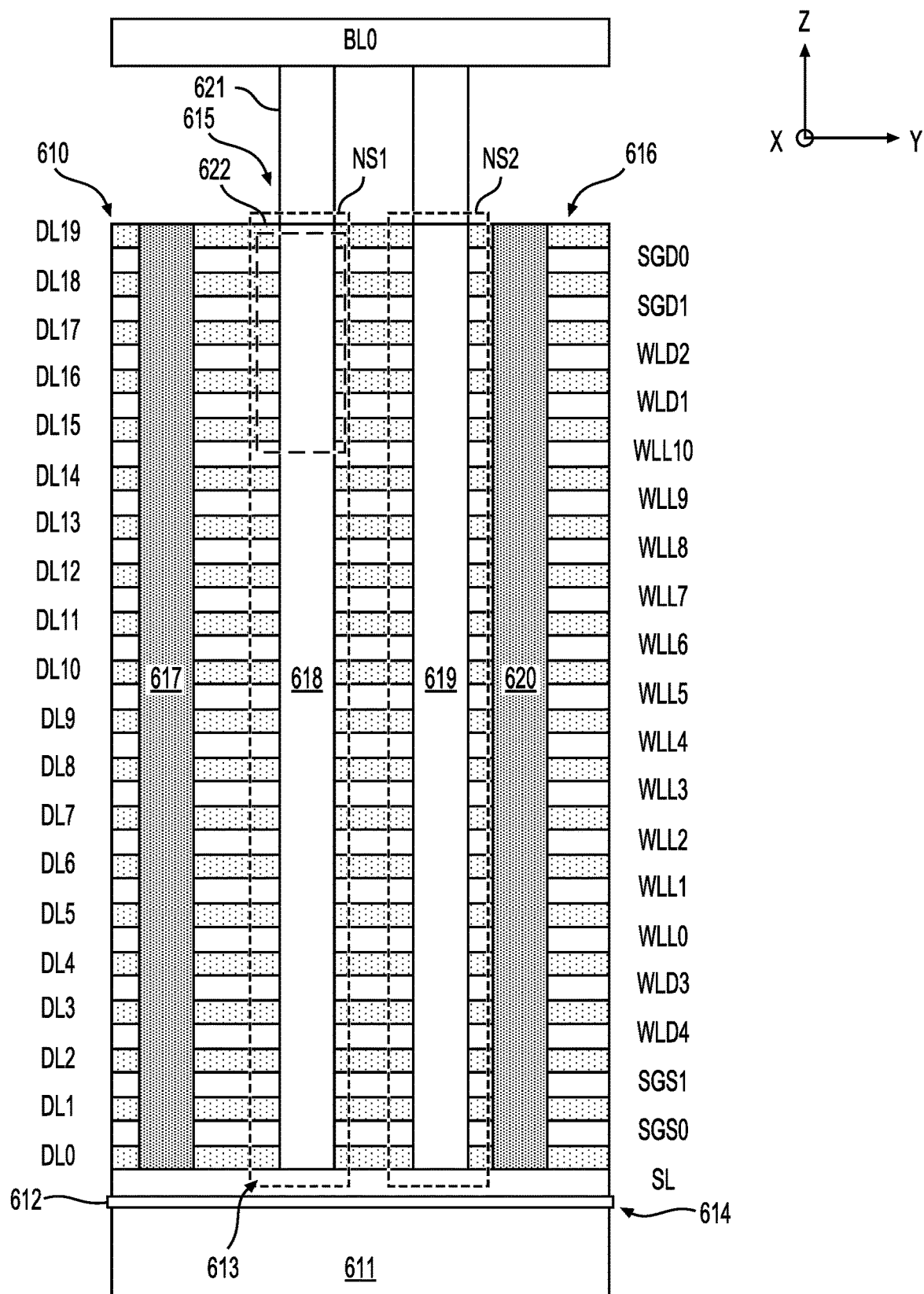
FIG. 4 depicts an example cross-sectional view of a portion of one of the blocks of FIG. 3 according to aspects of the disclosure.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack 610 includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

Figure 5:
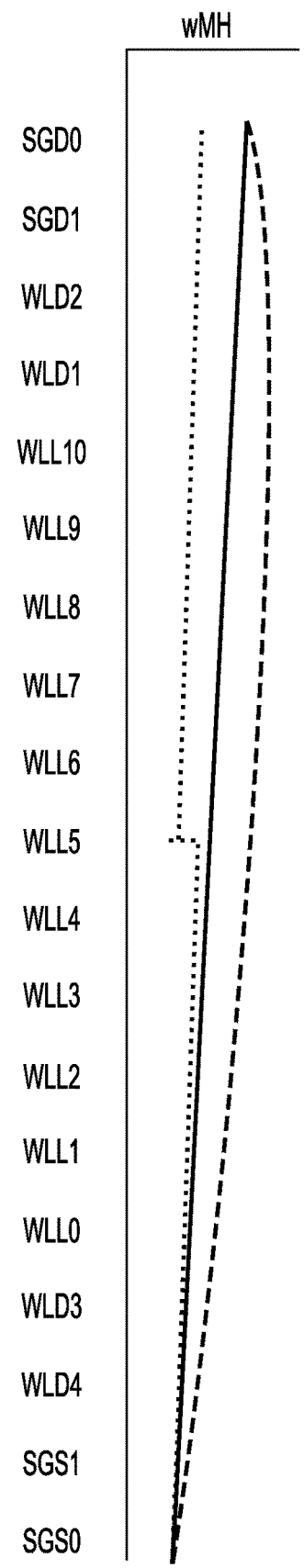
FIG. 5 depicts a plot of memory hole diameter in the stack of FIG. 4 according to aspects of the disclosure.

FIG. 5 depicts a plot of memory hole/pillar diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and resulting pillar, the programming and erase speed of the memory cells can vary based on their position along the memory hole. With a relatively smaller diameter at the bottom of a memory hole, the electric field across the tunnel oxide is relatively stronger, so that the programming and erase speed is higher for memory cells in word lines adjacent to the relatively smaller diameter portion of the memory holes.

Figure 12A:
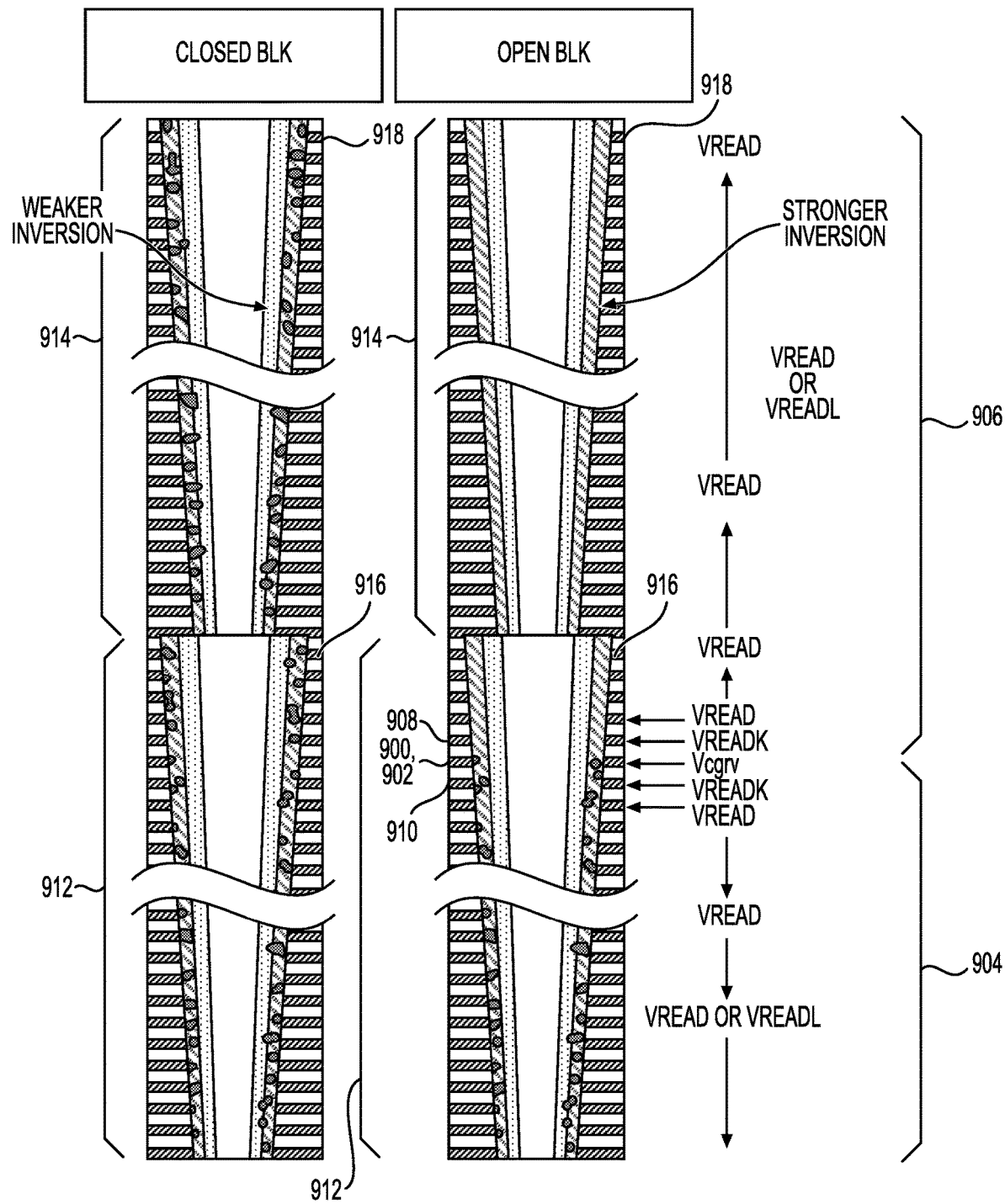
FIG. 12A shows an example arrangement of two tiers of the memory apparatus according to aspects of the disclosure.

In another possible implementation, represented by the short dashed line, the stack is fabricated in two tiers (also shown in FIG. 12A). The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Figure 6:
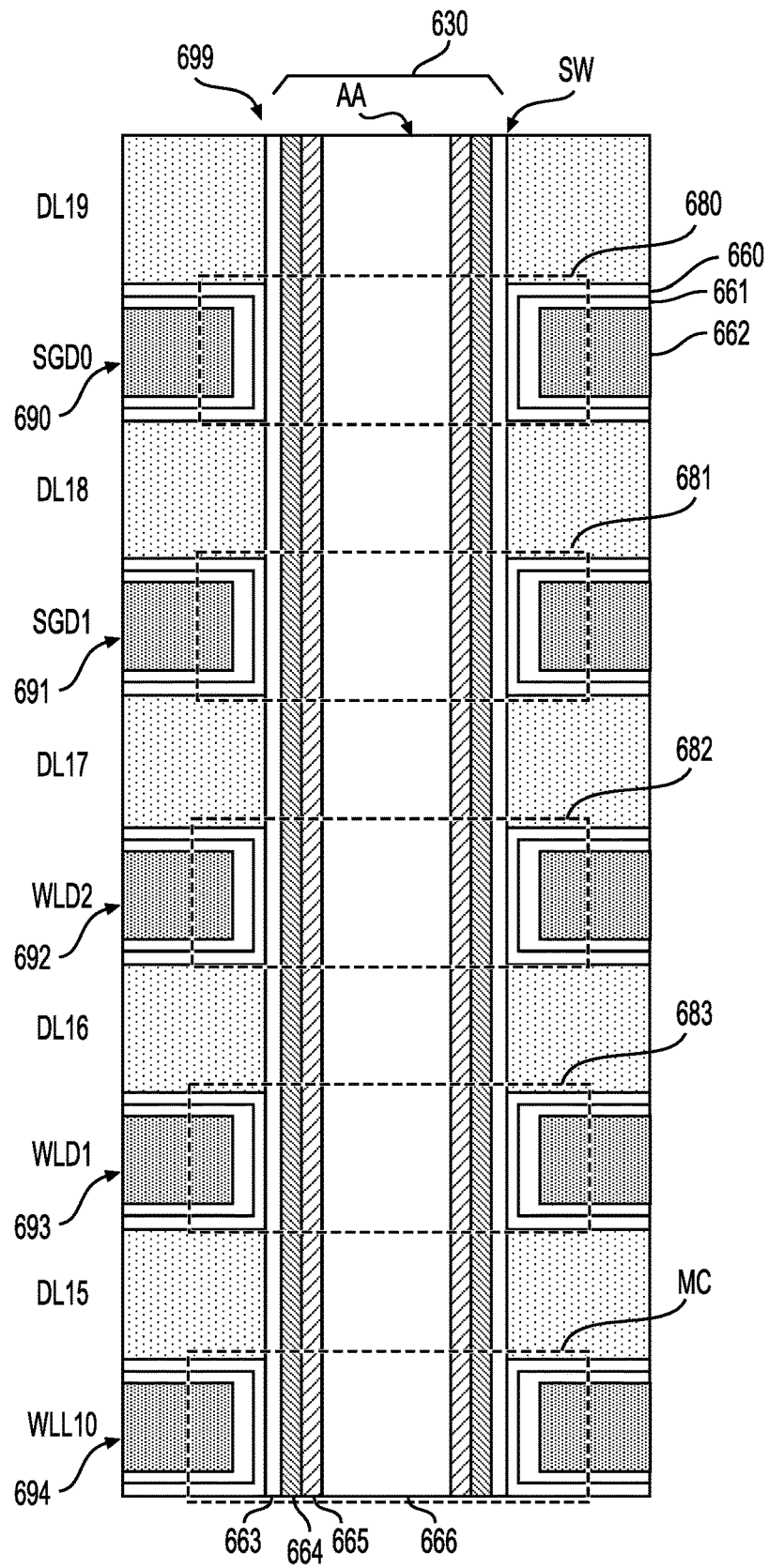
FIG. 6 depicts a close-up view of a region of the stack of FIG. 4 according to aspects of the disclosure.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride ($Si_3N_4$) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
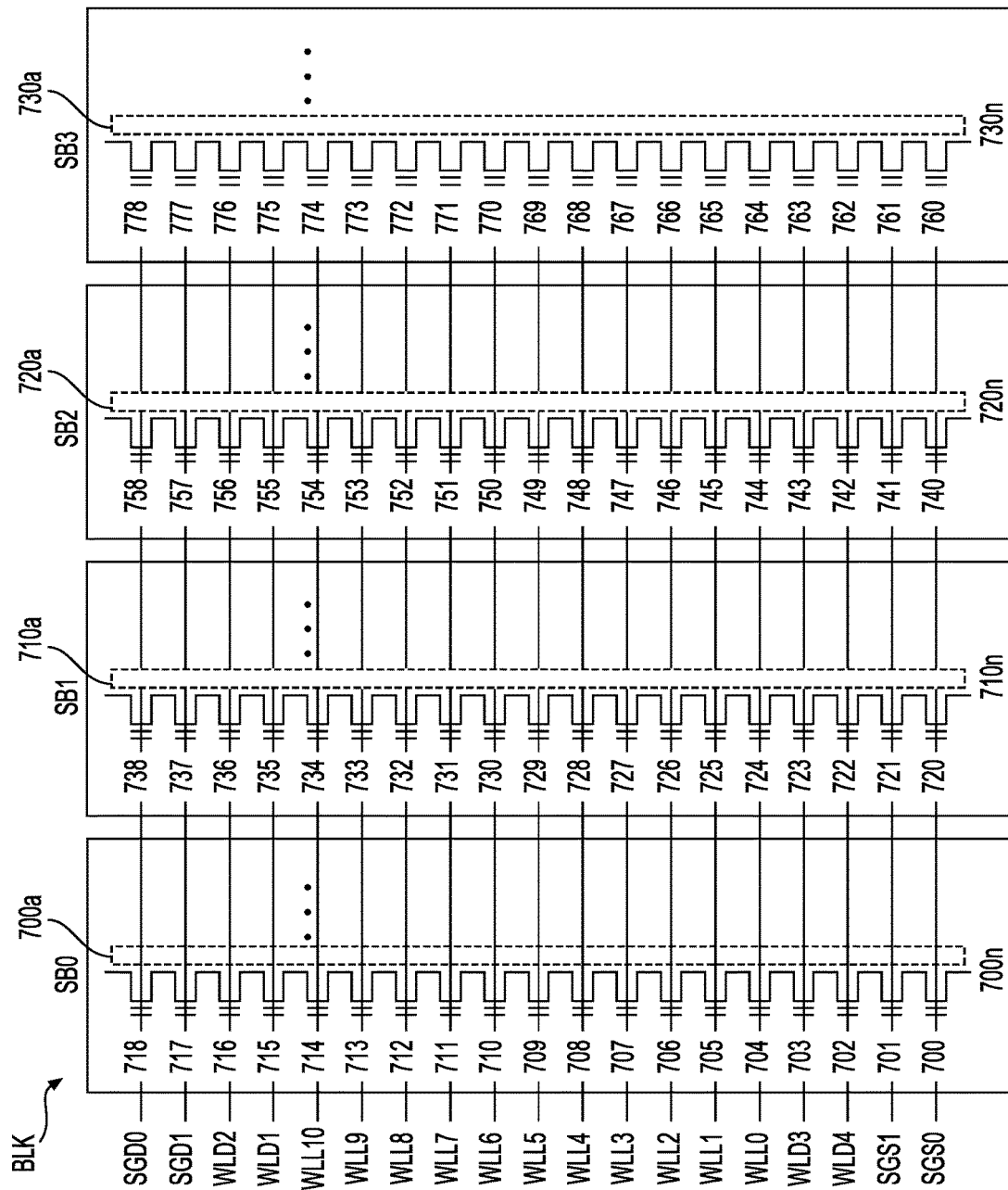
FIG. 7A depicts an example view of NAND strings in sub-blocks in a 3D configuration which is consistent with FIG. 4 according to aspects of the disclosure.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WLL0, the source-side word line and proceeding one word line at a time to WLL10, the drain-side word line.

The NAND strings 700n, 710n, 720n and 730n have channels 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final threshold voltage (Vth) distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 7B:
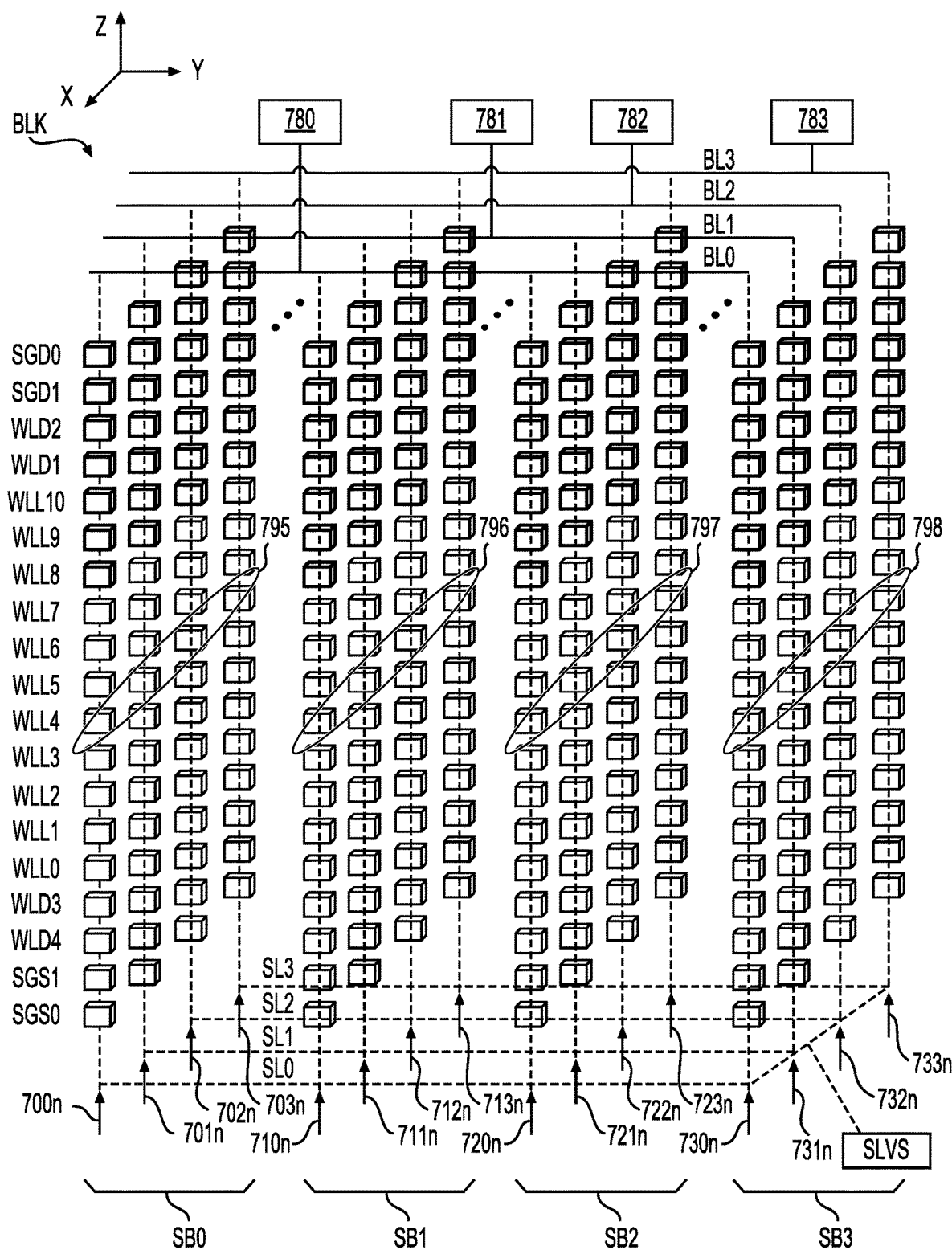
FIG. 7B depicts additional detail of the sub-blocks of FIG. 7A according to aspects of the disclosure.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the source lines SL0-SL3 are connected and driven at a common voltage by a voltage source, SLVS.

In another possible implementation, the source lines are separate and can be driven at respective voltages.

Figure 7C:
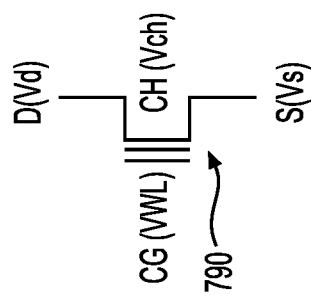
FIG. 7C depicts an example memory cell according to aspects of the disclosure.

FIG. 7C depicts an example memory cell 790. The memory cell comprises a control gate CG which receives a word line voltage Vwl, a drain at a voltage Vd, a source at a voltage Vs and a channel at a voltage Vch. During programming, the cell has a positive control gate-to-channel voltage which draws electrons into the charge trapping layer. During erase, the cell has a positive channel-to-gate voltage which repels electrons from the charge trapping layer.

Figure 8:
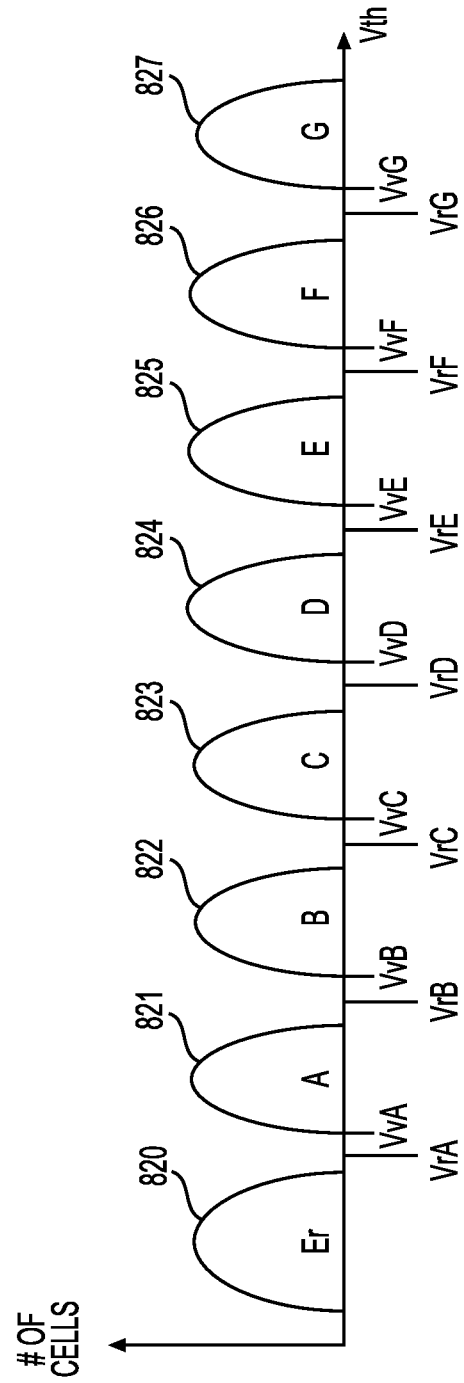
FIG. 8 depicts an example threshold voltage distribution of memory cells, where eight data states are used according to aspects of the disclosure.

FIG. 8 depicts an example Vth distribution of memory cells, where eight data states are used. The Er, A, B, C, D, E, F and G states have Vth distributions 820, 821, 822, 823, 824, 825, 826 and 827, respectively. For the A, B, C, D, E, F and G states, we have verify voltages VvA, VvB, VvC, VvD, VvE, VvF and VvG, respectively, and read voltages VrA, VrB, VrC, VrD, VrE, VrF and VrG, respectively, and example encoding of bits of 111, 110, 100, 000, 010, 011, 001 and 101, respectively. The bit format is: UP/MP/LP.

In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state at a sense time, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

As previously discussed, increased average current draw (Icc) for the memory apparatus can adversely affect battery life of a mobile device utilizing the memory apparatus. Thus, a smaller average current draw leads to more sustainable operation for the mobile device. However, current draw peak is equivalently important. If the current draw peak exceeds the system's spec, the power supply will be quenched and the memory apparatus will not work.

Figure 9:
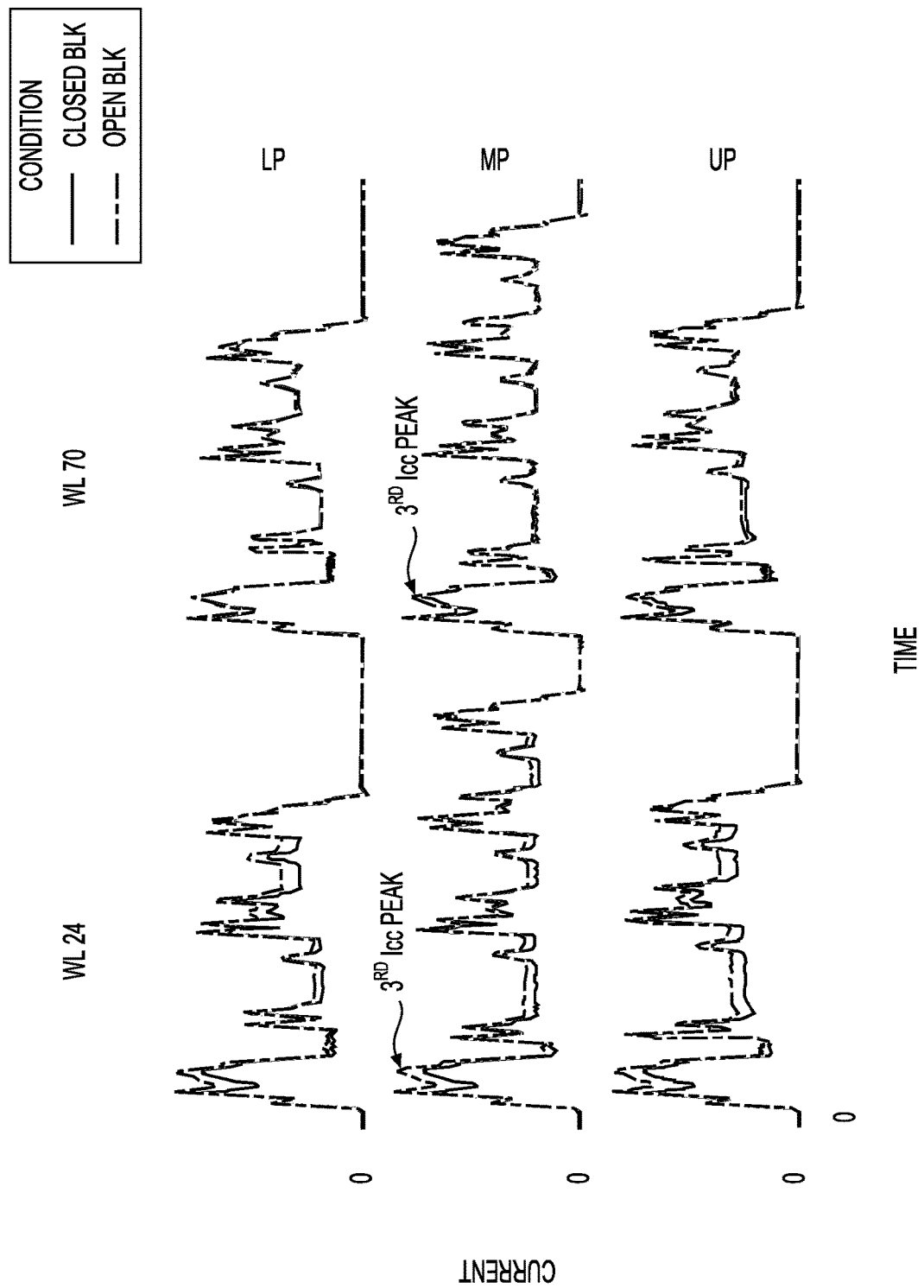
FIG. 9 shows current draw of an example memory apparatus during a read operation of lower, middle, and upper pages for two specific word lines in both the open block and closed block conditions according to aspects of the disclosure.

Open block is a common situation during the operation of the memory apparatus 100, 600. The memory system commonly programs several dies with usage of few word lines for consideration of program performance. However, it is observed that both peak Icc and average Icc increase when the blocks are not fully programmed (i.e., open block). FIG. 9 shows current draw of an example memory apparatus 100, 600 during a read operation of the lower page (LP), middle page (MP) and upper page (UP) for two specific word lines, (WL24 and WL70) in both the open block and closed block conditions. As shown, both the peak current draw and average current draw are higher for the open block condition.

The third current draw peak is labeled. The third current draw peak is related to array loading and it becomes the peak over the whole current spectra when the block is under a first read condition. The second and third current draw peaks are typically the largest current draw peaks. However, if for example, the memory die 108 being read includes more than three planes or tiers (discussed in more detail below), the third current draw peak will usually be the dominant peak.

Figure 10:
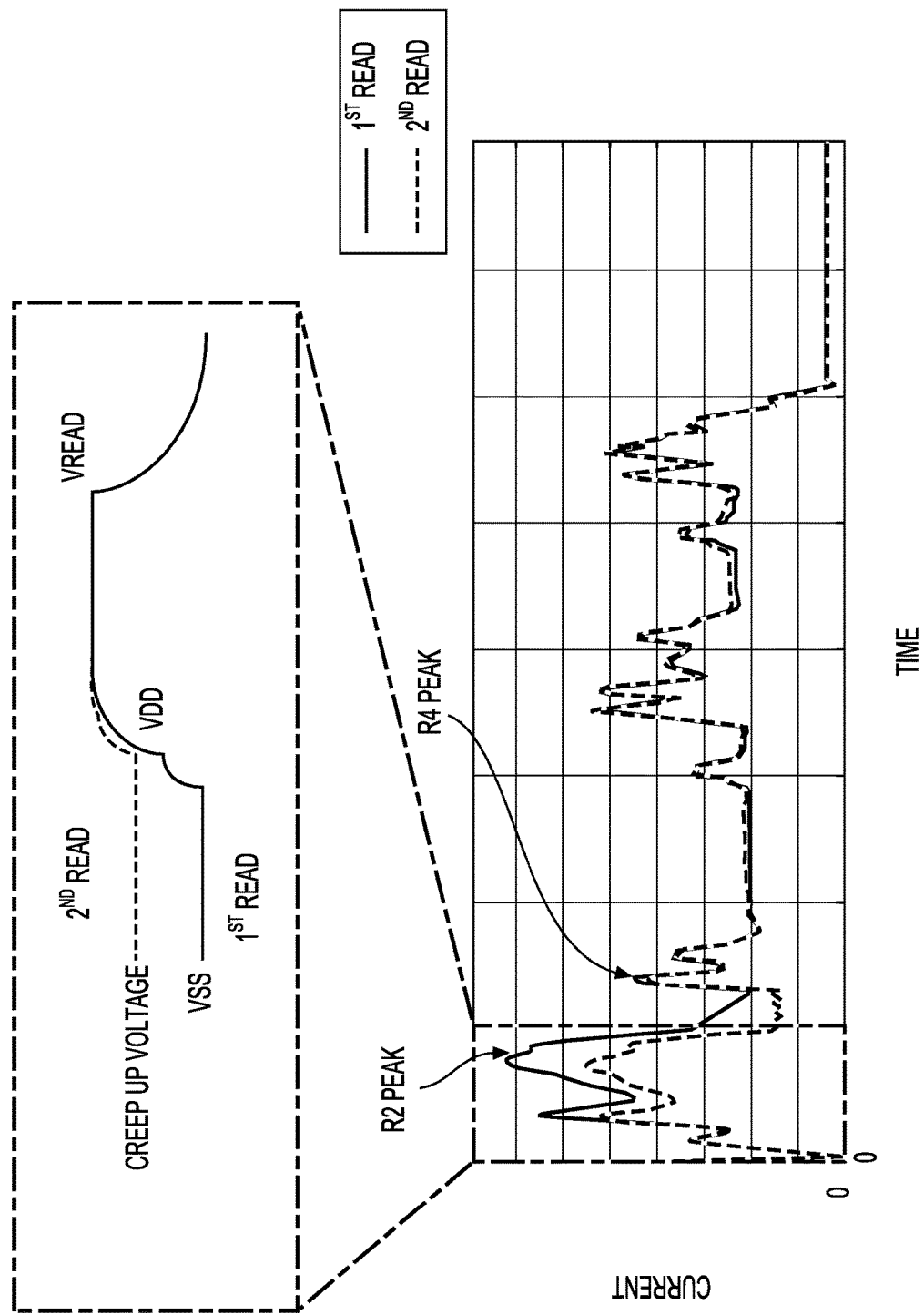
FIG. 10 illustrates more details regarding a third current draw peak that defines peak current for a read operation according to aspects of the disclosure.

As shown in FIG. 10, the third current draw peak (R2 peak) defines peak current among the whole read operation. The residue voltage remains after read operation results in smaller voltage change as well as smaller peak current draw. In contrast, steady state voltage (Vss) stress pulls all the word line potential to zero and leads to a larger voltage change and current draw peak. Indeed, the third peak is the dominant peak for two to four planes read operation.

Figure 11A:
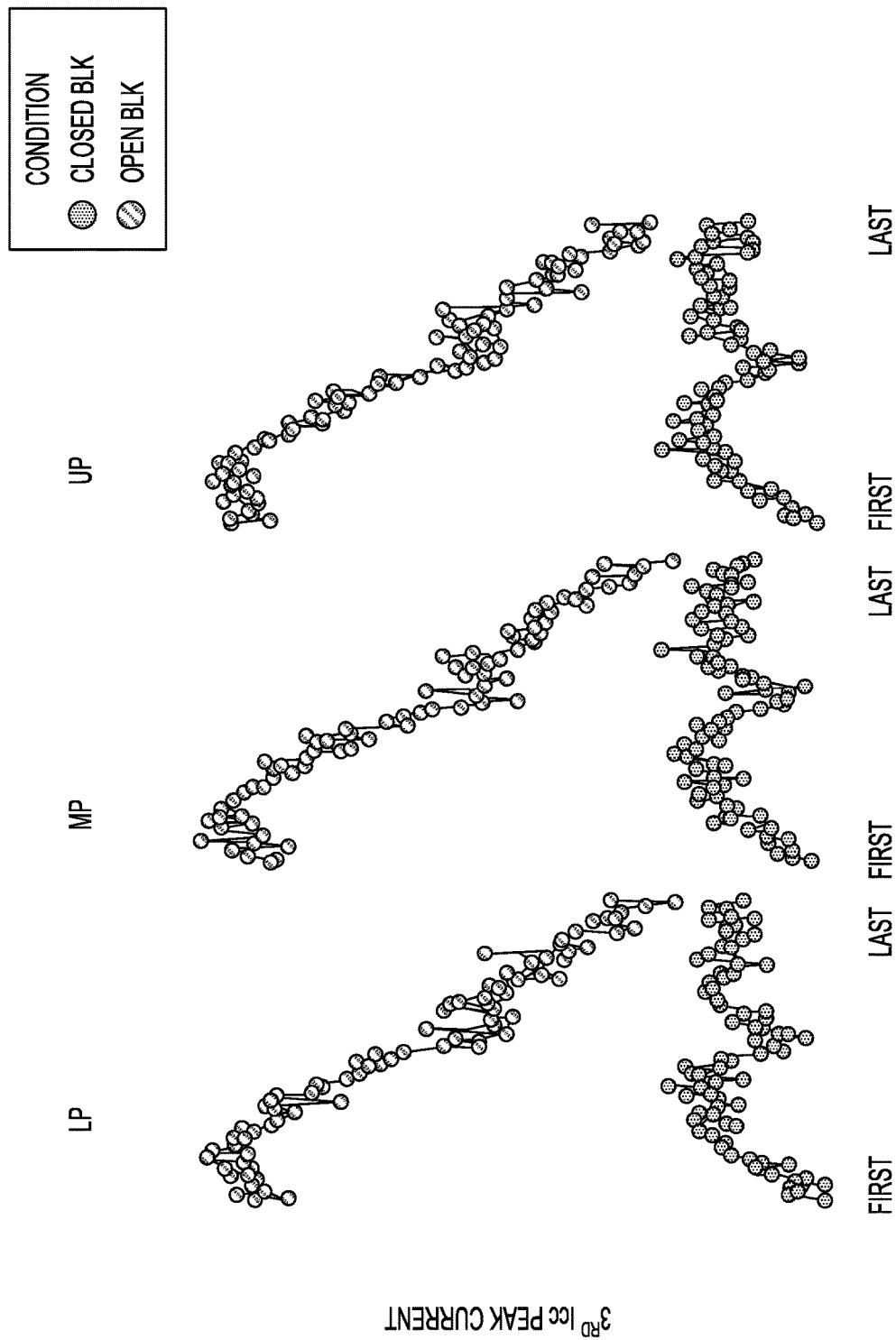
FIGS. 11A and 11B show a word line dependency of third current draw peak versus the closed or open block condition according to aspects of the disclosure.
Figure 11B:
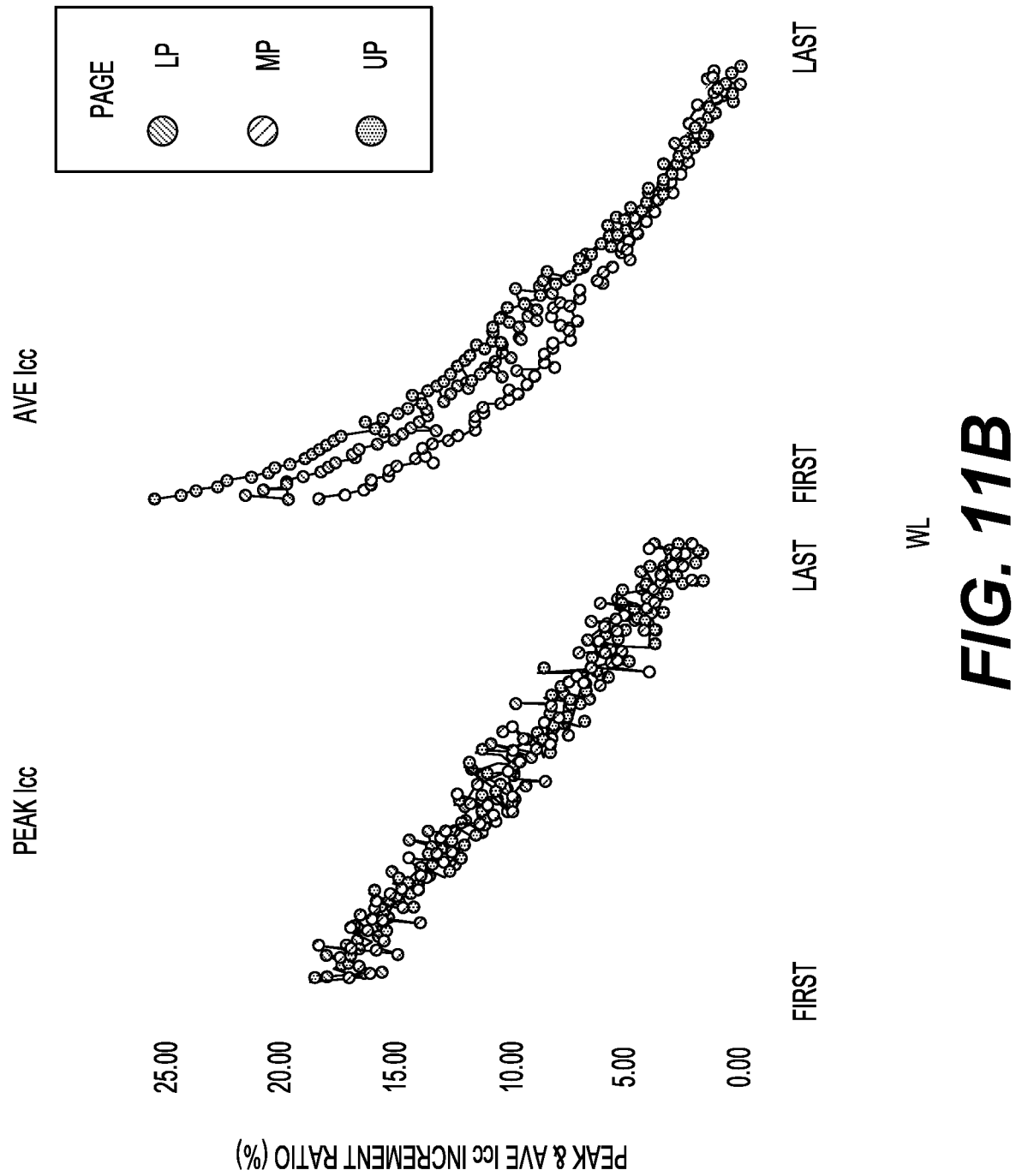

FIGS. 11A and 11B show the word line dependency of third current draw peak versus closed or open block condition with the word line indicated as first being closest to the substrate 611 (FIG. 4) and the last being furthest from the substrate 611. The third current draw peak exhibits a hump at the center of each tier of the memory hole for closed block condition. However, it shows a monotonically decreasing trend under open block condition. As shown, the third current draw peak can increase up to 16-19% for lower word lines (i.e. closer to the substrate 611). Average current draw can increase up to 19-26% for each page of lower word lines.

Figure 12B:
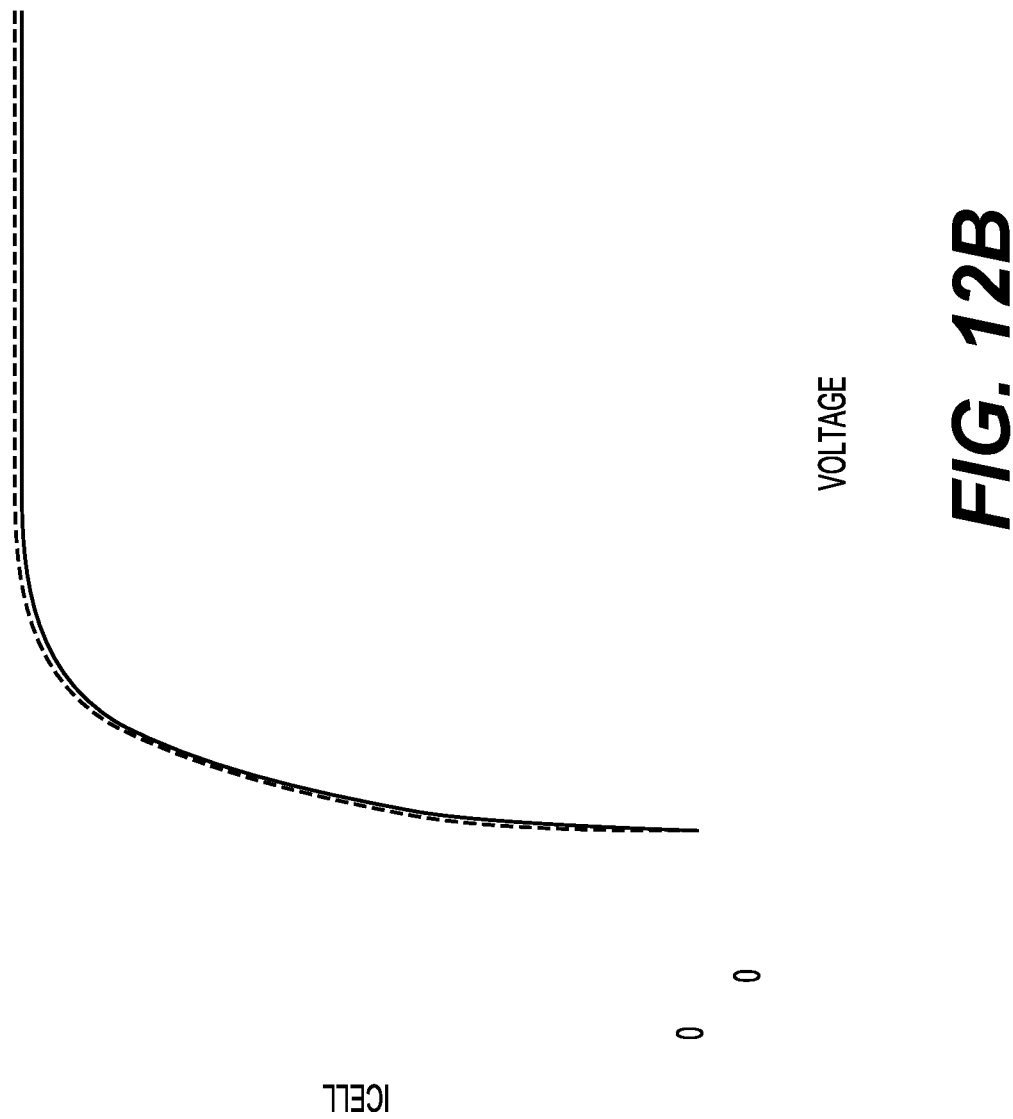
FIG. 12B illustrates a higher current draw resulting from a channel above WLn+2 exhibiting stronger channel inversion compared to the closed block condition according to aspects of the disclosure.

FIG. 12A shows an example arrangement of two tiers of the memory apparatus 100, 600. As discussed, the apparatus 100, 600 includes a block of memory cells arranged in strings and connected to word lines overlying one another in the stack. The memory cells of the apparatus 100, 600 include a first group of memory cells connected to a particular word line 900. The apparatus 100, 600 also includes the control circuit (e.g., control circuitry 110 and the controller 122) coupled to the word lines. The biasing voltage for the lower memory hole (MH) in a lower tier 912 can be either a default read pass voltage (VREAD) or a lower read pass voltage (VREADL) and the border of application of the VREADL voltage can be determined by the control circuit (e.g., using LAY_READ_EN). VREADL is smaller than the default read pass voltage (VREAD) and helps to compensate for the physical shape of the memory hole. However, despite the VREADL or VREAD setting, the third current draw peak and average current draw may be larger than closed block condition for the same word line. The same VREAD bias is applied above a boundary word line 902 (WLn) plus an offset number of word lines (e.g., WLn+2, the offset being two). If it is the open block condition, the channel above WLn+2 exhibits stronger channel inversion comparing to closed block condition and leads to higher current draw (Icc), as shown in FIG. 12B. While the particular word line 900 and the boundary word line 902 are shown as being the same word line in FIG. 12A, it should be appreciated that they may also be separate word lines.

Thus, in order to help reduce the peak and average current draw (Icc), the control circuit is configured to determine whether the memory cells of the block are all programmed. The control circuit is also configured to determine the boundary word line 902 splitting the word lines into a first word line set 904 connected to the memory cells that are programmed and a second word line set 906 connected to the memory cells that are not programmed in response to determining the memory cells of the block are not all programmed. The control circuit is additionally configured to apply a delta adjusted read voltage being a default read pass voltage (VREAD) minus a delta (Δ) voltage to a subset of the second word line set 906 separated from the boundary word line 902 in the stack (e.g., stack 610) by at least the offset number of the word lines while reading the first group of memory cells (those connected to the particular word line 900). The subset of the second word line set 906 may comprise any number of word lines (e.g., two word lines) up to the entire second word line set 906. At the same time, the control circuit can apply the default read pass voltage (VREAD) or the or a lower read pass voltage (VREADL) to the first word line set 904 in the stack while reading the first group of memory cells. The offset number of word lines can be two (i.e., WLn+2, the offset being two); however, it should be understood that other offset amounts are contemplated. Furthermore, the delta (Δ) voltage can also be a function of a position of the boundary word line 902.

The plurality of word lines includes at least one first neighbor word line 908 adjacent to the particular word line 900 in the stack and at least one second neighbor word line 910 also adjacent to the particular word line 900 in the stack. Although only one of each of the at least one first and second neighbor word lines 908, 910 are shown in FIG. 12A, other quantities of the at least one first and second neighbor word lines 908, 910 are contemplated. Consequently, the control circuit is further configured to apply a read voltage (Vcgrv) to the particular word line 900 while reading the first group of memory cells. The control circuit also applies a neighbor word line voltage (VREADK) being higher than the default read pass voltage (VREAD) to each of the at least one first and second neighbor word lines 908, 910 while reading the first group of memory cells. The offset number of word lines being two accounts for the application of the neighbor word line voltage (VREADK) to each of the at least one first and second neighbor word lines 908, 910.

Referring back to FIG. 5 in addition to FIG. 12A, each of the strings comprises the memory hole (e.g., memory holes 618, 619) extending vertically through the stack and having a plurality of tiers (e.g., the lower tier 912 and an upper tier 914) vertically aligned with one another in the stack and each including a portion of the memory cells. The word lines can, therefore, include a tier periphery word line 916 coupled to one of the plurality of tiers (e.g., lower tier 912) and disposed adjacent to and below another of the plurality of tiers (e.g., upper tier 914) in the stack. In addition, the word lines can include a last word line 918 disposed at a top of the stack and overlaying a remainder of the word lines. Thus, the control circuit is further configured to apply the default read pass voltage (VREAD) to the tier periphery word line 916 while reading the first group of memory cells. The control circuit also applies the default read pass voltage (VREAD) to the last word line 918 while reading the first group of memory cells.

If the control circuit determines that the memory cells of the block are all programmed, the control circuit can simply carry out a conventional or default read. So, for example, the control circuit is further configured to apply the read voltage (Vcgrv) to the particular word line 900 while reading the first group of memory cells in response to determining the memory cells of the block are all programmed. The control circuit is also configured to apply the neighbor word line voltage (VREADK) being higher than the default read pass voltage (VREAD) to each of the at least one first neighbor word line 908 adjacent to the particular word line 900 and the at least one second neighbor word line 910 adjacent to the particular word line 900 while reading the first group of memory cells in response to determining the memory cells of the block are all programmed.

Referring back to FIG. 4, the memory apparatus 100, 600 can also include the substrate 611 having a major surface extending laterally from (i.e., the x direction) and along a longitudinal axis (i.e., the y direction). The word lines extend along and over the major surface of the substrate longitudinally and alternate with insulating layers between the word lines along the vertical axis (i.e., the z direction) perpendicular to the longitudinal axis to form the stack. For example, the memory cells connected to the word lines are programmed beginning with the memory cells closest to the substrate along the vertical axis (e.g., starting with WLL0) and ending with the memory cells furthest from the substrate along the vertical axis (e.g., ending with WLL10). Therefore, in an open block, the first word line set 904 that is connected to the memory cells being programmed is below the second word line set 906 (along the z direction) that is connected to the memory cells that are not programmed in the stack. As mentioned above, the delta (Δ) voltage can also be a function of the position of the boundary word line 902, for example, a larger Δ may be used for a lower boundary word line 902 (e.g., closer to the substrate 611) and a smaller Δ may be used for a higher boundary word line 902 (e.g., further from the substrate 611). So, the control circuit is further configured to determine the delta (Δ) voltage based on a boundary position of the boundary word line 902 along the vertical axis (i.e., the z direction) in the stack relative to the substrate 611. The boundary position is how close or far the boundary word line 902 is from the substrate.

Figure 13A:
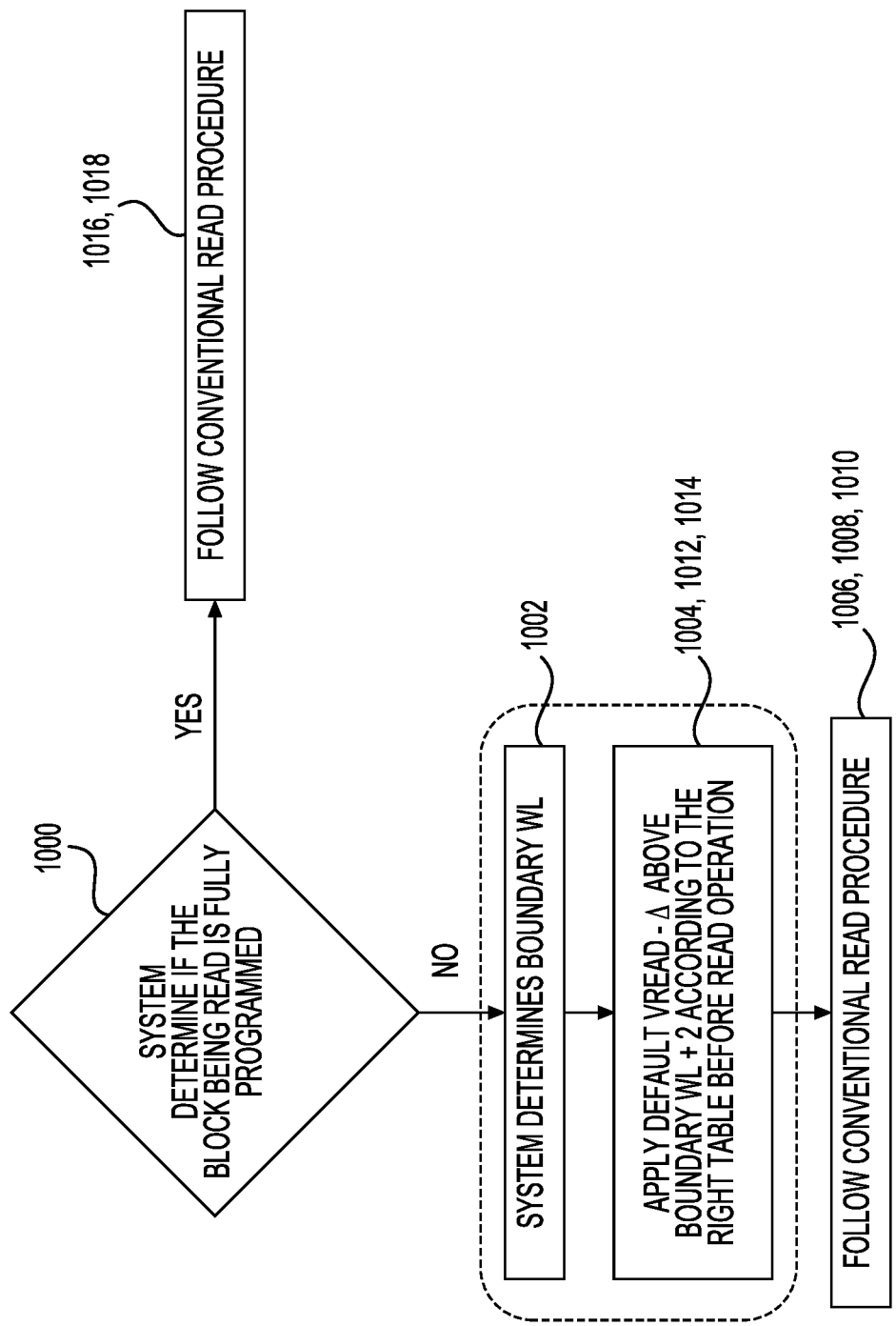
FIG. 13A illustrates steps of a method of operating a memory apparatus according to aspects of the disclosure.

As best shown in FIGS. 13A and 13B, a method of operating the memory apparatus 100, 600 including the block of memory cells arranged in strings and connected to word lines overlying one another in the stack is also provided. In general, the apparatus 100, 600 (e.g., control circuit) first determines if the block being read is fully programmed. If yes, the apparatus 100, 600 follows the conventional read procedure. If not, the apparatus 100, 600 determines the boundary word line 902. Specifically, the apparatus 100, 600 applies a binary search to find the boundary word line 902. According to the position of the boundary word line 902, the apparatus 100, 600 adjusts VREAD above boundary word line 902 plus the offset number of word lines (e.g., two word lines) as shown in the table of FIG. 13B. The delta (Δ) voltage can be any real number and can vary based on the boundary position of the boundary word line 902.

As discussed, the memory cells of the memory apparatus 100, 600 include the first group of memory cells connected to the particular word line 900. So, as best shown in FIG. 13A, the method includes the step of 1000 determining whether the memory cells of the block are all programmed. The next step of the method is 1002 determining a boundary word line 902 splitting the word lines into a first word line set 904 connected to the memory cells being programmed and a second word line set 906 connected to the memory cells being not programmed in response to determining the memory cells of the block are not all programmed. The method continues with the step of 1004 applying a delta adjusted read voltage being a default read pass voltage (VREAD) minus a delta (Δ) voltage to the second word line set 906 separated from the boundary word line 902 in the stack by at least an offset number of the word lines while reading the first group of memory cells. Again, the offset number of word lines can be two, for example and the Δ voltage may change according to the position of the boundary word line 902.

Then, the apparatus 100, 600 follows a normal read operation, so the method further includes the step of 1006 applying a read voltage (Vcgrv) to the particular word line 900 while reading the first group of memory cells. The method continues by 1008 applying a neighbor word line voltage (VREADK) being higher than the default read pass voltage (VREAD) to each of the at least one first and second neighbor word lines 908, 910 while reading the first group of memory cells. The method further includes the step of 1010 applying the default read pass voltage (VREAD) to the first word line set 904 in the stack while reading the first group of memory cells.

As discussed, each of the strings comprises the memory hole (e.g., memory hole 618 or 619 of FIG. 4) extending vertically through the stack and having a plurality of tiers (e.g., lower tier 912 and upper tier 914) vertically aligned with one another in the stack and each including a portion of the memory cells (see e.g., FIGS. 5 and 12A). The word lines include a tier periphery word line 916 coupled to one of the plurality of tiers (e.g., the lower tier 912) and disposed adjacent to and below another of the plurality of tiers (e.g., the upper tier 914) in the stack. The word lines also include a last word line 918 disposed at a top of the stack and overlaying a remainder of the word lines. The method further including the steps of 1012 applying the default read pass voltage (VREAD) to the tier periphery word line 916 while reading the first group of memory cells and applying the default read pass voltage (VREAD) to the last word line 918 while reading the first group of memory cells according to the table shown in FIG. 13B. The VREAD in the table is the same read pass voltage used for the closed block condition. Word line (WL) x in the table is the last WL of lower tier 912, which can, for example, be numbered 47 or 79 (e.g., with word line number 0 closest to the substrate 611). The last word line 918 can be numbered 96 or 160, for example. If there are more than two tiers 912, 914, there will be several WL x.

If the block is a closed block instead of an open block, the apparatus 100, 600 follows the normal read operation. Thus, the method also includes the step of 1016 applying a read voltage (Vcgrv) to the particular word line 900 while reading the first group of memory cells in response to determining the memory cells of the block are all programmed. The method continues with the step of 1018 applying a neighbor word line voltage (VREADK) being higher than the default read pass voltage (VREAD) to each of at least one first neighbor word line 908 adjacent to the particular word line 900 and at least one second neighbor word line 910 adjacent to the particular word line 900 while reading the first group of memory cells in response to determining the memory cells of the block are all programmed.

Figure 14:
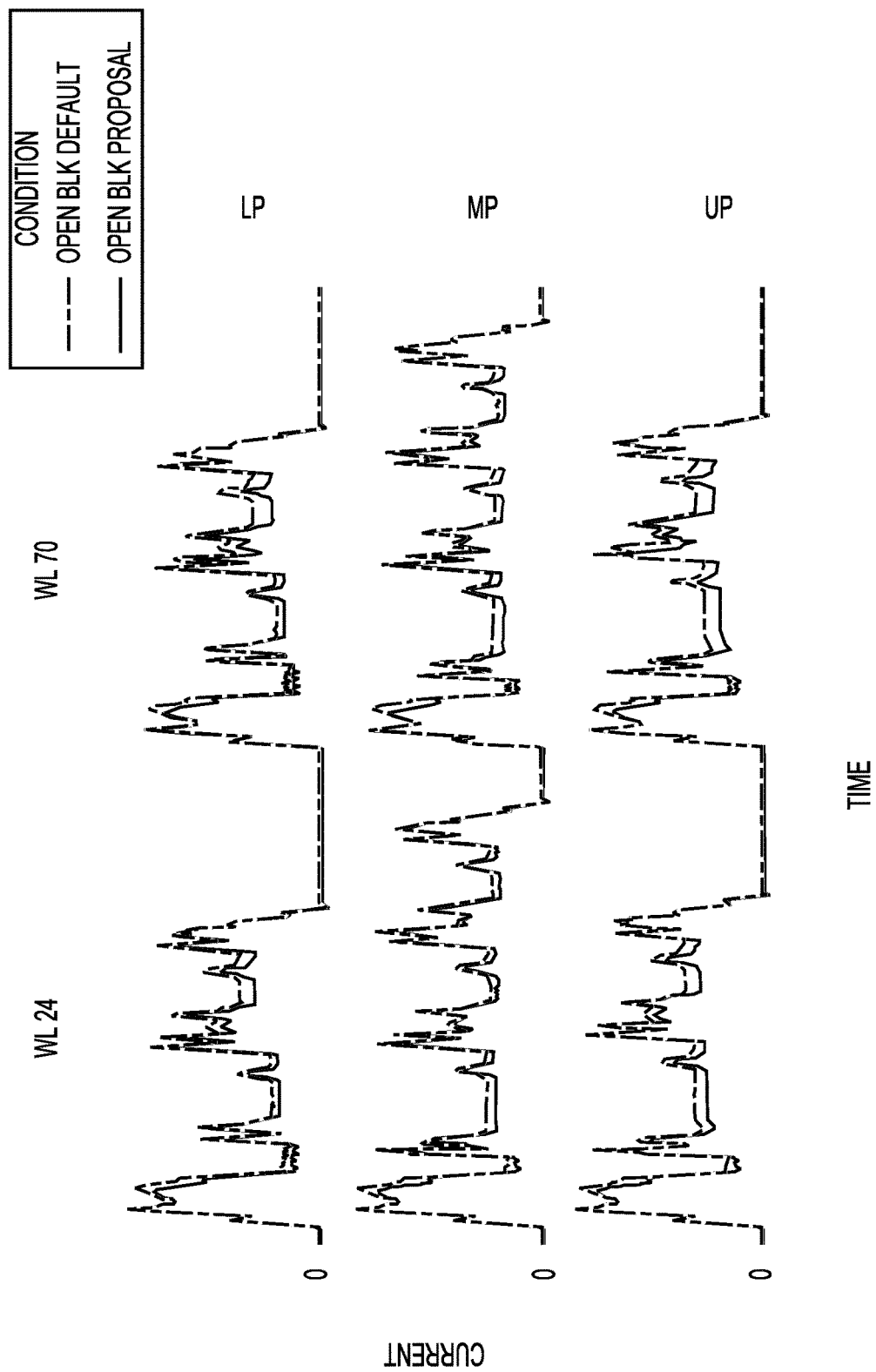
FIG. 14 illustrates the third current draw peak and average current draw in a lower tier or lower memory hole and the third current draw peak and average current draw during reading memory cells in an upper tier or upper memory hole for both open block and closed block operation according to aspects of the disclosure.

As best shown in FIG. 14, the memory apparatus 100, 600 and method described herein advantageously improves the third current draw peak of 9.2-11.7% as well as average current draw of 8.4-14.2% compared to the open block operation.

Figure 15A:
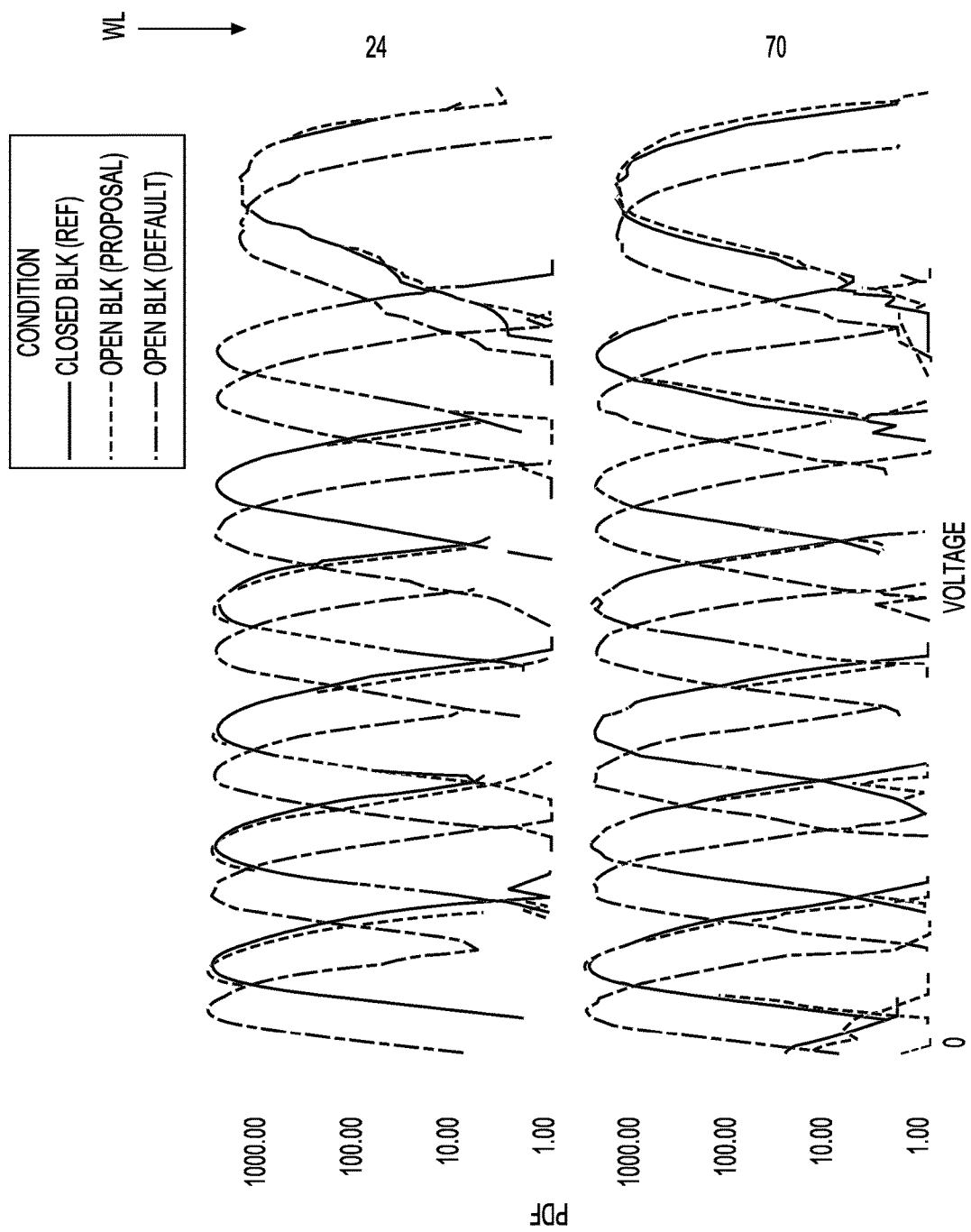
FIG. 15A shows a simulated threshold voltage distribution for the open block condition using the memory apparatus with the closed block condition as a reference according to aspects of the disclosure.
Figure 15B:
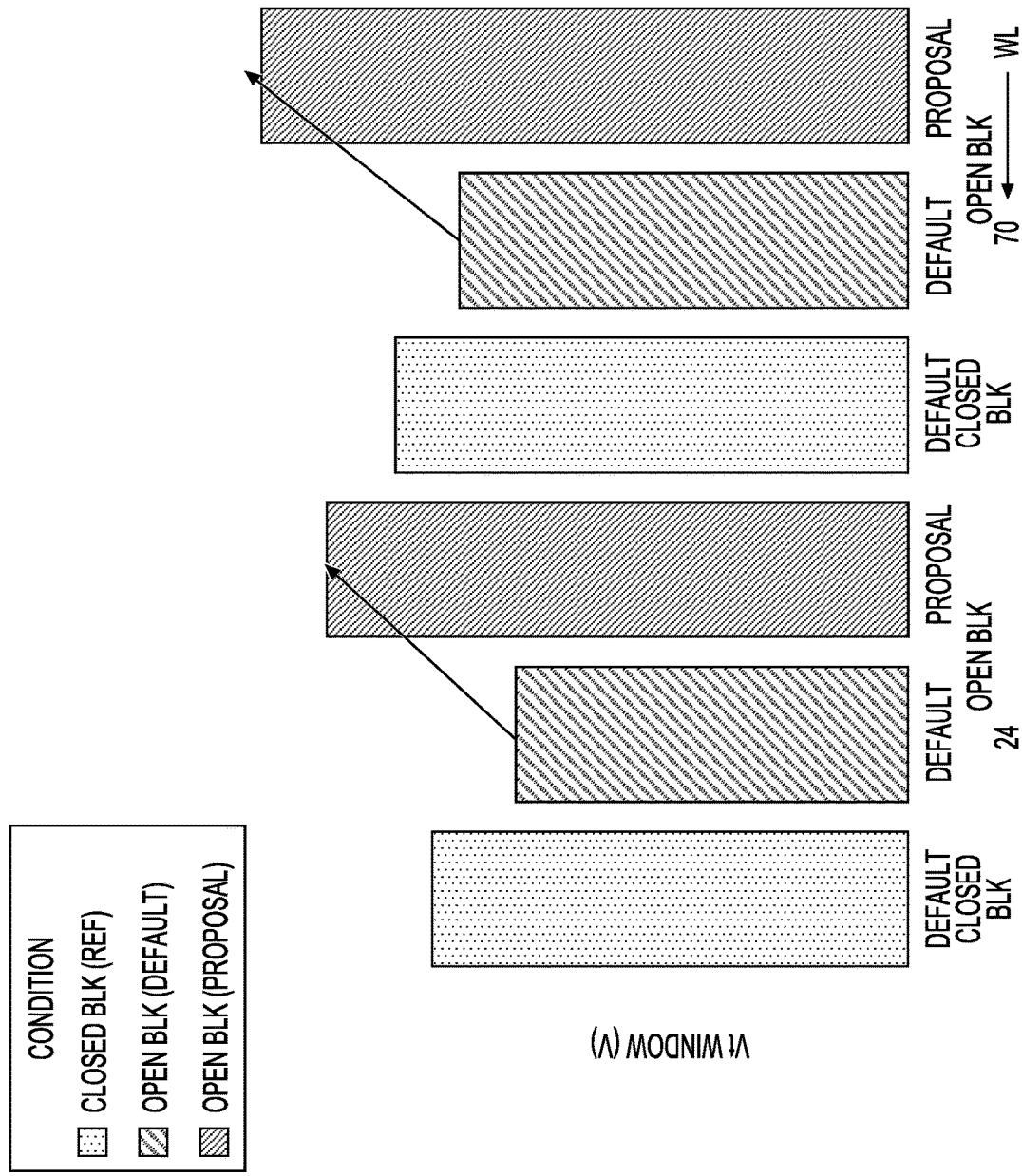
FIG. 15B illustrates an improvement in the threshold window for two specific word lines according to aspects of the disclosure.

FIG. 15A shows the threshold voltage (Vt) distribution among closed block as a reference, and open block using the memory apparatus 100, 600 and method described herein. For the same word line, the Vt distribution shifts left under open block condition due to lack of the neighboring word line interference (NWI) effect. Because the memory apparatus 100, 600 and method described herein applies a smaller VREAD under open block condition, which shifts the Vt distribution right. In summary, current draw is reduced as well as enlarged threshold voltage window. As shown in FIG. 15B, the threshold window (e.g., spacing between programmed data states A, B, C, D, E, F, G in FIG. 8) is observed to improve for word line 24 and word line 70.

Figure 16:
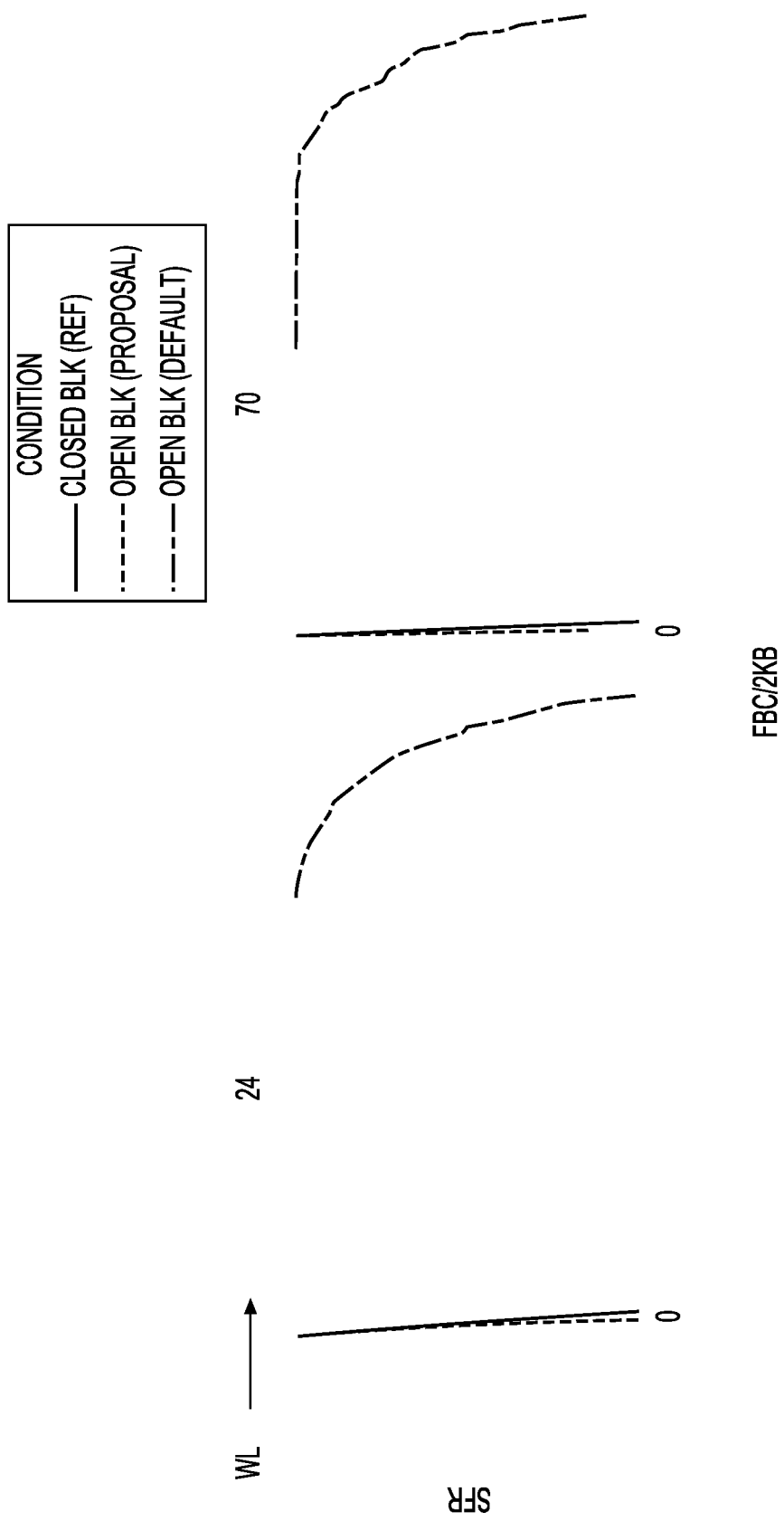
FIG. 16 shows fail bit counts for the memory apparatus in a default open block condition and using the memory apparatus with the closed block condition as a reference according to aspects of the disclosure.

As shown in FIG. 16, the open block condition with default VREAD exhibits extreme large fail bit counts (FBC). So, as described above, it is necessary to optimize the read level for the open block condition as described above. The memory apparatus 100, 600 and method described herein achieves comparable FBC (to the closed block condition) without optimizing read level. Thus, it may be possible to save more storage nodes in userrom or fuserom for other usage.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "Inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
   a block of memory cells arranged in strings and connected to word lines overlying one another in a stack, the memory cells including a first group of memory cells connected to a particular word line; and
   a control circuit coupled to the word lines and configured to:
   determine whether the memory cells of the block are all programmed,
   determine a boundary word line splitting the word lines into a first word line set connected to the memory cells being programmed and a second word line set connected to the memory cells being not programmed in response to determining the memory cells of the block are not all programmed, and
   apply a delta adjusted read voltage being a default read pass voltage minus a delta voltage to a subset of the second word line set separated from the boundary word line in the stack by at least an offset number of the word lines while reading the first group of memory cells.

2. The apparatus as set forth in claim 1, wherein the plurality of word lines includes at least one first neighbor word line adjacent to the particular word line in the stack and a at least one second neighbor word line adjacent to the particular word line in the stack, and the control circuit is further configured to:
   apply a read voltage to the particular word line while reading the first group of memory cells, and
   apply a neighbor word line voltage being higher than the default read pass voltage to each of the at least one first and second neighbor word lines while reading the first group of memory cells.

3. The apparatus as set forth in claim 1, wherein each of the strings comprises a memory hole extending vertically through the stack and having a plurality of tiers vertically aligned with one another in the stack and each including a portion of the memory cells, the word lines including a tier periphery word line coupled to one of the plurality of tiers and disposed adjacent to and below another of the plurality of tiers in the stack, the word lines including a last word line disposed at a top of the stack and overlaying a remainder of the word lines, and the control circuit is further configured to:
   apply the default read pass voltage to the tier periphery word line while reading the first group of memory cells, and
   apply the default read pass voltage to the last word line while reading the first group of memory cells.

4. The apparatus as set forth in claim 1, wherein the control circuit is further configured to:
   apply a read voltage to the particular word line while reading the first group of memory cells in response to determining the memory cells of the block are all programmed, and
   apply a neighbor word line voltage being higher than the default read pass voltage to each of at least one first neighbor word line adjacent to the particular word line and at least one second neighbor word line adjacent to the particular word line while reading the first group of memory cells in response to determining the memory cells of the block are all programmed.

5. The apparatus as set forth in claim 1, wherein the control circuit is further configured to apply a default read pass voltage to the first word line set in the stack while reading the first group of memory cells.

6. The apparatus as set forth in claim 1, further including a substrate having a major surface extending laterally from and along a longitudinal axis and wherein the word lines extend along and over the major surface of the substrate longitudinally and alternate with insulating layers between the word lines along a vertical axis perpendicular to the longitudinal axis to form the stack and the memory cells connected to the word lines are programmed beginning with the memory cells closest to the substrate along the vertical axis and ending with the memory cells furthest from the substrate along the vertical axis, the first word line set connected to the memory cells being programmed being below the second word line set connected to the memory cells being not programmed in the stack.

7. The apparatus as set forth in claim 6, wherein the control circuit is further configured to determine the delta voltage based on a boundary position of the boundary word line along the vertical axis in the stack relative to the substrate.

8. A controller in communication with a block of memory cells of a memory apparatus arranged in strings and connected to word lines overlying one another in a stack, the memory cells including a first group of memory cells connected to a particular word line, the controller configured to:
   instruct the memory apparatus to determine whether the memory cells of the block are all programmed;
   determine a boundary word line splitting the word lines into a first word line set connected to the memory cells being programmed and a second word line set connected to the memory cells being not programmed in response to determining the memory cells of the block are not all programmed; and
   instruct the memory apparatus to apply a delta adjusted read voltage being a default read pass voltage minus a delta voltage to a subset of the second word line set separated from the boundary word line in the stack by at least an offset number of the word lines while reading the first group of memory cells.

9. The controller as set forth in claim 8, wherein the plurality of word lines includes at least one first neighbor word line adjacent to the particular word line in the stack and at least one second neighbor word line adjacent to the particular word line in the stack, and the controller is further configured to:
   instruct the memory apparatus to apply a read voltage to the particular word line while reading the first group of memory cells; and instruct the memory apparatus to apply a neighbor word line voltage being higher than the default read pass voltage to each of the at least one first and second neighbor word lines while reading the first group of memory cells.

10. The controller as set forth in claim 8, wherein each of the strings comprises a memory hole extending vertically through the stack and having a plurality of tiers vertically aligned with one another in the stack and each including a portion of the memory cells, the word lines including a tier periphery word line coupled to one of the plurality of tiers and disposed adjacent to and below another of the plurality of tiers in the stack, the word lines including a last word line disposed at a top of the stack and overlaying a remainder of the word lines, and the controller is further configured to:
   instruct the memory apparatus to apply the default read pass voltage to the tier periphery word line while reading the first group of memory cells; and
   instruct the memory apparatus to apply the default read pass voltage to the last word line while reading the first group of memory cells.

11. The controller as set forth in claim 8, wherein the controller is further configured to:
   instruct the memory apparatus to apply a read voltage to the particular word line while reading the first group of memory cells in response to determining the memory cells of the block are all programmed, and
   instruct the memory apparatus to apply a neighbor word line voltage being higher than the default read pass voltage to each of at least one first neighbor word line adjacent to the particular word line and at least one second neighbor word line adjacent to the particular word line while reading the first group of memory cells in response to determining the memory cells of the block are all programmed.

12. The controller as set forth in claim 8, wherein the controller is further configured to instruct the memory apparatus to apply a default read pass voltage to the first word line set in the stack while reading the first group of memory cells.

13. The controller as set forth in claim 8, wherein the controller is further configured to determine the delta voltage based on a boundary position of the boundary word line in the stack.

14. A method of operating a memory apparatus including a block of memory cells arranged in strings and connected to word lines overlying one another in a stack, the memory cells including a first group of memory cells connected to a particular word line, the method comprising the steps of:
   determining whether the memory cells of the block are all programmed;
   determining a boundary word line splitting the word lines into a first word line set connected to the memory cells being programmed and a second word line set connected to the memory cells being not programmed in response to determining the memory cells of the block are not all programmed; and
   applying a delta adjusted read voltage being a default read pass voltage minus a delta voltage to a subset of the second word line set separated from the boundary word line in the stack by at least an offset number of the word lines while reading the first group of memory cells.

15. The method as set forth in claim 14, wherein the plurality of word lines includes at least one first neighbor word line adjacent to the particular word line in the stack and at least one second neighbor word line adjacent to the particular word line in the stack, the method further including the steps of:
   applying a read voltage to the particular word line while reading the first group of memory cells; and
   applying a neighbor word line voltage being higher than the default read pass voltage to each of the at least one first and second neighbor word lines while reading the first group of memory cells.

16. The method as set forth in claim 14, wherein each of the strings comprises a memory hole extending vertically through the stack and having a plurality of tiers vertically aligned with one another in the stack and each including a portion of the memory cells, the word lines including a tier periphery word line coupled to one of the plurality of tiers and disposed adjacent to and below another of the plurality of tiers in the stack, the word lines including a last word line disposed at a top of the stack and overlaying a remainder of the word lines, the method further including the steps of:
   applying the default read pass voltage to the tier periphery word line while reading the first group of memory cells, and
   applying the default read pass voltage to the last word line while reading the first group of memory cells.

17. The method as set forth in claim 14 further including the steps of:
   applying a read voltage to the particular word line while reading the first group of memory cells in response to determining the memory cells of the block are all programmed; and
   applying a neighbor word line voltage being higher than the default read pass voltage to each of at least one first neighbor word line adjacent to the particular word line and at least one second neighbor word line adjacent to the particular word line while reading the first group of memory cells in response to determining the memory cells of the block are all programmed.

18. The method as set forth in claim 14 further including the step of applying a default read pass voltage to the first word line set in the stack while reading the first group of memory cells.

19. The method as set forth in claim 14, wherein the memory apparatus further includes a substrate having a major surface extending laterally from and along a longitudinal axis and the word lines extend along and over the major surface of the substrate longitudinally and alternate with insulating layers between the word lines along a vertical axis perpendicular to the longitudinal axis to form the stack and the method further includes the step of programming the memory cells connected to the word lines beginning with the memory cells closest to the substrate along the vertical axis and ending with the memory cells furthest from the substrate along the vertical axis, wherein the first word line set connected to the memory cells being programmed is below the second word line set connected to the memory cells being not programmed in the stack.

20. The method as set forth in claim 19, further including the step of determining the delta voltage based on a boundary position of the boundary word line along the vertical axis in the stack relative to the substrate.

* * * * *